US007633788B2

United States Patent
Choi et al.

(10) Patent No.: US 7,633,788 B2
(45) Date of Patent: Dec. 15, 2009

(54) VARIABLE RESISTIVE MEMORY WORDLINE SWITCH

(75) Inventors: Byung-Gil Choi, Yongin-si (KR); Woo-Yeong Cho, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 3 days.

(21) Appl. No.: 11/750,802

(22) Filed: May 18, 2007

(65) Prior Publication Data

US 2008/0080229 A1    Apr. 3, 2008

(30) Foreign Application Priority Data

Oct. 2, 2006    (KR)  .................. 10-2006-0097008

(51) Int. Cl.
*G11C 11/00*    (2006.01)
(52) U.S. Cl. ...................................... 365/148; 365/203
(58) Field of Classification Search ................. 365/148, 365/158
See application file for complete search history.

(56) References Cited

U.S. PATENT DOCUMENTS 5,459,692 A * 10/1995 Shin et al. .................... 365/203
6,256,254 B1    7/2001 Kwak et al.
6,327,202 B1   12/2001 Roohparvar
6,493,268 B1   12/2002 Khouri et al.
6,791,859 B2    9/2004 Hush
2004/0196719 A1 * 10/2004 Aritomi et al. ............... 365/222
2005/0270883 A1   12/2005 Cho et al.
2005/0281080 A1 * 12/2005 Dray et al. ................... 365/171
2006/0023497 A1    2/2006 Kawazoe et al.
2006/0059405 A1    3/2006 Parkinson

FOREIGN PATENT DOCUMENTS

WO    03058632    7/2003

* cited by examiner

*Primary Examiner*—Hoai V Ho
*Assistant Examiner*—Anthan T Tran
(74) *Attorney, Agent, or Firm*—F. Chau & Associates, LLC

(57) ABSTRACT

A variable resistive memory device includes a main wordline, a wordline connecting switch in signal communication with the main wordline, a sub-wordline in signal communication with the wordline connecting switch, and a variable resistive memory cell having a variable resistance in signal communication with a first terminal of a switching element, a second terminal of the switching element disposed in signal communication with the sub-wordline; and a method of controlling the voltage of a sub-wordline in a variable resistive memory device includes switchably passing a voltage from a main wordline to the sub-wordline, and substantially blocking forward current flow from the sub-wordline to a variable resistive memory cell of the device.

16 Claims, 11 Drawing Sheets

FIG. 1 (BACKGROUND)

FIG. 2 (BACKGROUND)

VARIABLE RESISTIVE MEMORY WORDLINE SWITCH

CROSS-REFERENCE TO RELATED APPLICATION

This application claims foreign priority under 35 U.S.C. § 119 to Korean Patent Application No. P2006-0097008, filed on Oct. 2, 2006, in the Korean Intellectual Property Office the disclosure of which is incorporated by reference herein in its entirety,

BACKGROUND OF THE INVENTION

The present invention relates to variable resistive memory devices, and more particularly to variable resistive memory devices having hierarchical wordline structures. As the demand for both high density and low power consumption continues to increase, a new generation of memory devices has emerged. The new generation of memory devices includes both nonvolatile characteristics for low power consumption and easy scalability for high density, There have been three basic types of the new generation memory devices, including Phase change Random Access Memory (PRAM), Resistive Random Access Memory (RRAM) and Magnetic Random Access Memory (MRAM).

As shown in FIG. 1, a unit memory cell for a memory device is indicated generally by the reference numeral 100. The unit memory cell 100 has a variable resistive material part 110 connected to a switching element 112, such as a transistor or a diode. Here, the variable resistive material part 110 and the switching element 112 are connected in series between a bitline BL and a wordline WL. In accordance with the particular characteristics of the variable resistive material part 110, the memory device may be one of PRAM, RRAM or MRAM. If the variable resistive material part 110 includes an upper electrode, a lower electrode, and phase change material between the upper and lower electrodes, the memory device may be classified as PRAM. If the variable resistive material part is made of upper and lower electrodes with a Complex Metal Oxide (COMO) between them, the memory device may be classified as RRAM. If the variable resistive material part is made of upper and lower electrodes, where the upper electrode is magnetic, with an insulating material between the electrodes, the memory device may be classified as MRAM.

A common characteristic of the three basic types of new generation memory devices is that a current flows from a bitline BL to a wordline WL, or vice versa, when a write operation or a read operation occurs. For simplicity of explanation, the description that follows assumes that the variable resistive material is a phase change material, but it shall be understood that the present disclosure extends to all types of new generation memory devices.

Turning to FIG. 2, a memory array or device 200 includes a plurality of unit memory cells 100 as described with respect to FIG. 1, The memory array 200 includes a row decoder and main wordline (MWL) driver 210 connected to memory blocks BLK0 through BLKn, main wordlines MWL_0 through MWL_I connected to each MWL driver respectively, sub wordline (SWL) drivers 220 each connected to one of the main wordlines MWL_0 through MWL_I, sub wordlines SWL each connected to sub wordline drivers of a main wordline, and bitlines BL in each memory block that connect through memory cells to the sub wordlines, Each sub wordline driver is located among the memory blocks and supplies appropriate voltage to the corresponding sub wordline in response to the main wordline voltage. The sub wordline drivers are of the inverter type, including a PMOS transistor 222 and an NMOS transistor 224. The PMOS 222 supplies high voltage to the sub wordline and the NMOS 224 supplies low voltage to the sub wordline.

Because each sub wordline driver has both PMOS and NMOS transistors, the layout for the sub wordline driver includes a well region to isolate each PMOS transistor from the corresponding NMOS transistor. Thus, the layout area for each sub wordline driver with well regions introduces a constraint on the minimum size for reducing the size of the memory array 200. In addition, because the voltage of a main wordline is different from that of sub wordline, if the main wordline and sub wordline became electrically shorted, such as due to a process problem, for example, repair may be difficult.

SUMMARY OF THE INVENTION

These and other issues are addressed by a variable resistive memory wordline switch and related methods. Exemplary embodiments are provided.

An exemplary variable resistive memory device includes a main wordline, a wordline connecting switch in signal communication with the main wordline, a sub-wordline in signal communication with the wordline connecting switch, and a variable resistive memory cell having a variable resistance in signal communication with a first terminal of a switching element, a second terminal of the switching element disposed in signal communication with the sub-wordline.

Another exemplary variable resistive memory device includes a main wordline, a wordline connecting switch in signal communication with the main wordline, a sub-wordline in signal communication with the wordline connecting switch, a variable resistive memory cell having a variable resistor in signal communication with a first terminal of a switching element, a second terminal of the switching element disposed in signal communication with the sub-wordline, a sub-wordline pre-charging switch in signal communication with the sub-wordline a pre-charge voltage selector in signal communication with the sub-wordline pre-charging switch where the pre-charge voltage selector having a first switch in signal communication with a first voltage greater than a write voltage and a second switch in signal communication with a second voltage less than the first voltage and greater than a read voltage and a precharge disabling switch disposed between the pre-charge voltage selector and the subwordline pre-charging switch for disabling pre-charging of sub-wordlines.

An exemplary method of controlling the voltage of a sub-wordline in a variable resistive memory device includes switchably passing a voltage from a m main wordline to the sub-wordline, and substantially blocking forward current flow from the sub-wordline to a variable resistive memory cell of the device.

The present disclosure will be further understood from the following description of exemplary embodiments, which is to be read in connection with the accompanying drawings.

BRIEF DESCRIPTION OF THE DRAWINGS

The present disclosure provides a variable resistive memory wordline switch and related method in accordance with the following exemplary figures, in which.

DETAILED DESCRIPTION OF PREFERRED EMBODIMENTS

Exemplary embodiments of the present disclosure may reduce layout size by connecting a main wordline to a sub wordline with only one switching element, such as one transistor. In addition, the voltage of a main wordline may have substantially the same voltage as an associated sub wordline, which secures read and write operations. To prevent disturbances to non-selected memory cells, non-selected sub wordlines have a first boosting voltage when a write operation occurs and a second boosting voltage when a read operation occurs.

Figure 3:
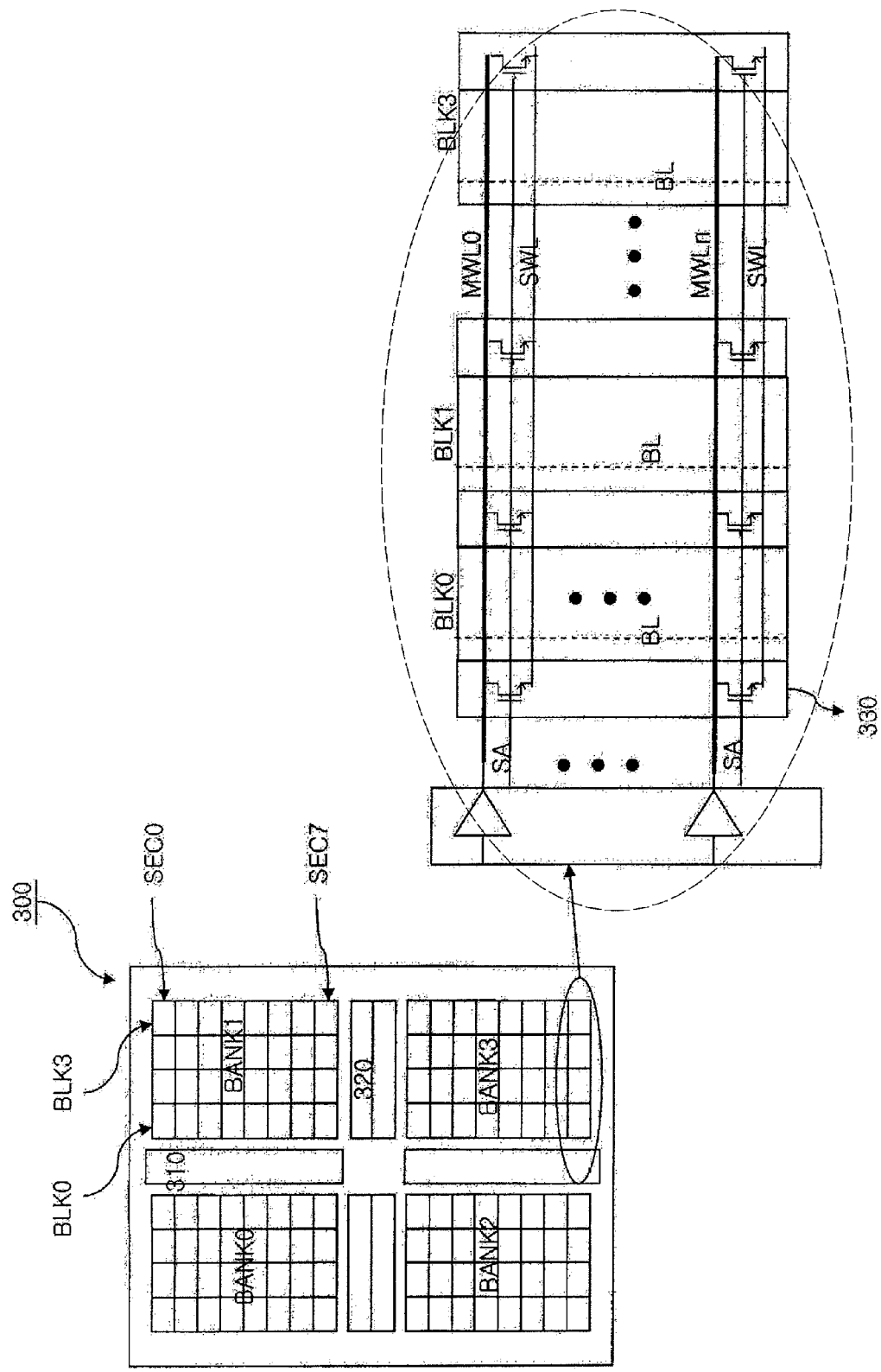
FIG. 3 shows a schematic diagram for a memory device in accordance with an exemplary embodiment of the present disclosure.

Turning now to FIG. 3, a memory device in accordance with an exemplary embodiment of the present disclosure is indicated generally by the reference numeral 300. The memory device 300 includes a plurality of memory banks, BANK0 through BANK5, a row decoder and main wordline driver unit 310, and a column decoder and data in/out circuits unit 320. Each memory bank includes a plurality of memory sectors SEC1 through SEC7, each of which has a plurality of memory blocks BLK0 through BLKS.

In operation, the row decoder and main wordline driver unit 310 selects a main wordline and supplies an appropriate voltage to it. The column decoder and data in/out circuits unit 320 selects a bitline in each memory block and writes data to a memory cell and/or reads data from a memory cell.

Figure 1:
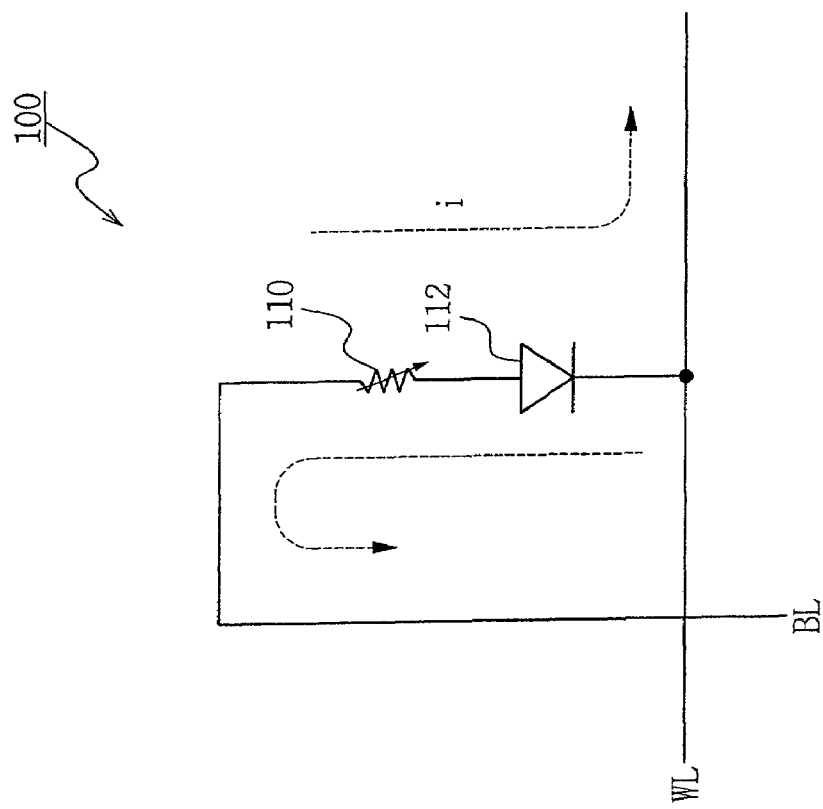
FIG. 1 shows a schematic circuit diagram for a unit memory cell, which is provided as background material.

Memory sector SEC7 in BANK3 will now be explained in detail, It shall be understood that the other sectors in this bank and in the other memory banks have comparable structures. Thus, duplicate description is omitted. SEC7 includes memory blocks BLK0, BLK1 BLK2 and BLK3, and wordline connecting pads 330 connected between each SWL and corresponding MWL in each block. That is a MWL is formed over the SEC7 and a SWL is connected together in each memory block. Each memory block has memory cells, which may be the same as d described with respect to FIG. 1. Each wordline connecting part 330 is formed among the memory blocks and includes only an NMOS transistor. That is, there is no corresponding PMOS transistor. A gate of the NMOS transistor is connected to a sub wordline selection signal (SA), a drain of the NMOS transistor is connected to the MWL, and a source of NMOS transistor is connected to the SWL.

Figure 2:
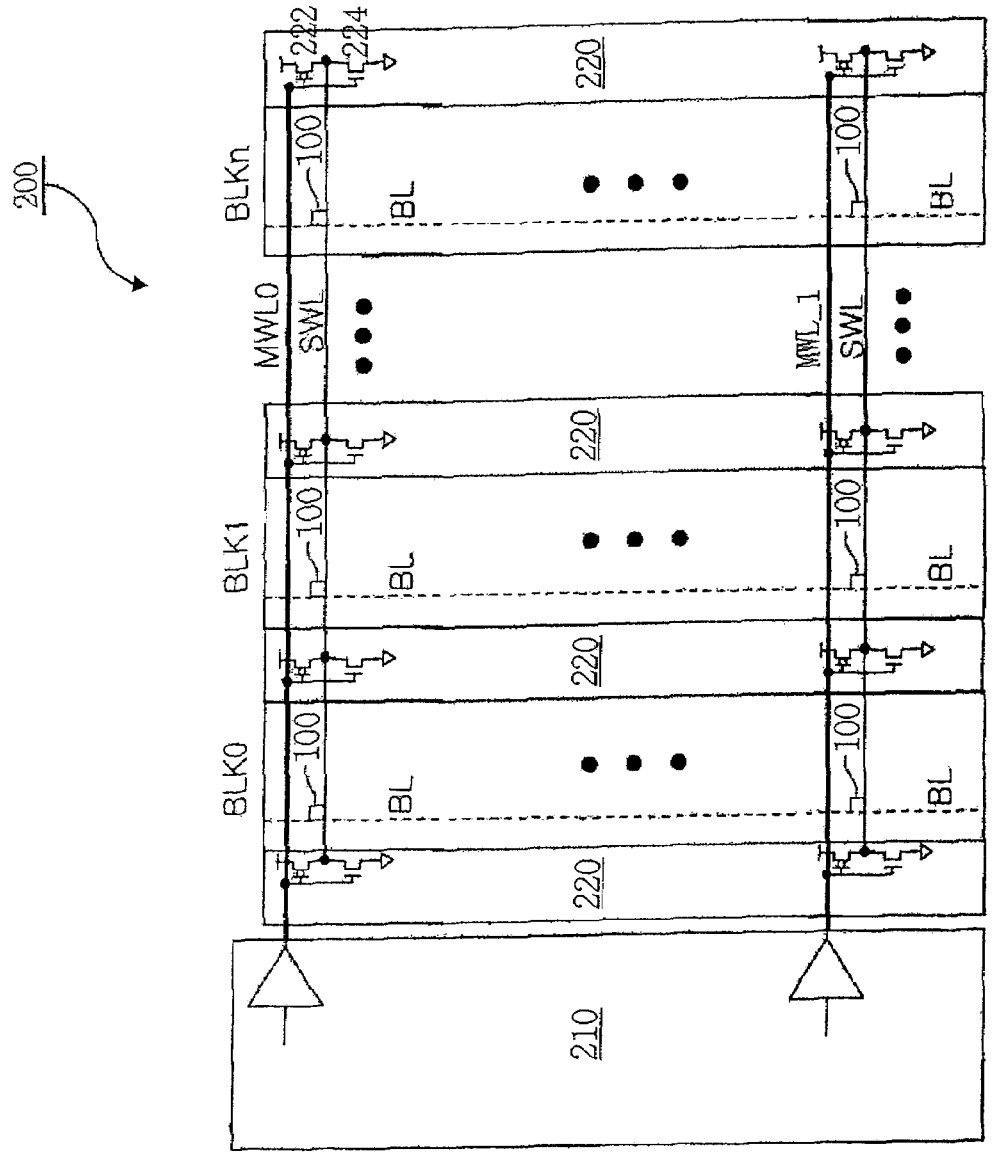
FIG. 2 shows a schematic diagram for a memory device, which is provided as background material.

In alternate embodiments, the NMOS transistors may be completely replaced with PMOS transistors. That is, the memory device 300 according to the present disclosure has a wordline connection part 330 comprising only one transistor, so that layout size can be smaller than the memory device 200 of FIG. 2, for example, For example, the variable resistive memory device 300 includes a main wordline, a wordline connecting switch in signal communication with the main wordline in response to a sub-wordline selection signal, a sub-wordline in signal communication with the wordline connecting switch, and a variable resistive memory cell having a variable resistance in signal communication with a first terminal of a switching element, a second terminal of the switching element disposed in signal communication with the sub-wordline.

Figure 4:
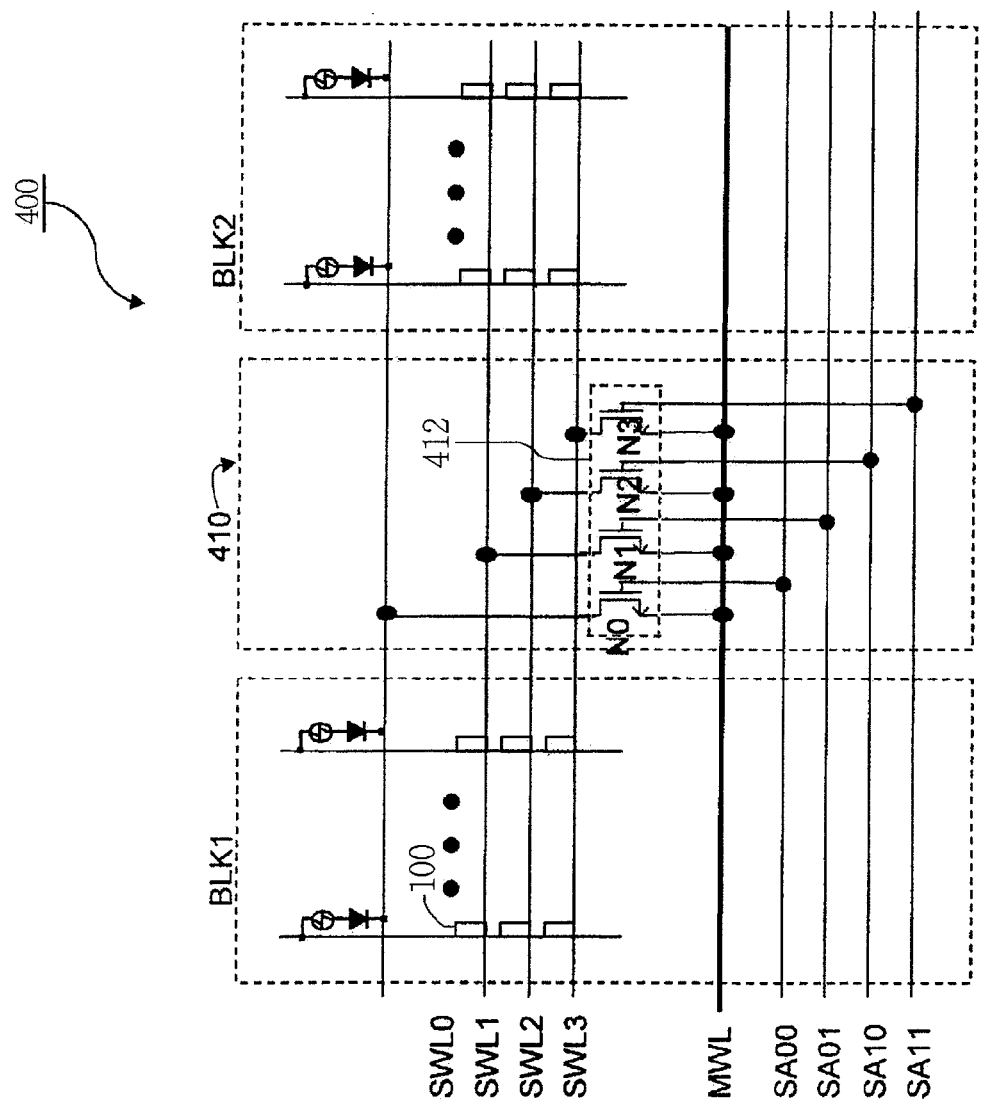
FIG. 4 shows a schematic circuit diagram for a wordline switch of a memory device in accordance with FIG. 3.

As shown in FIG. 4, a circuit for a wordline connecting part or switch is indicated generally by the reference numeral 400. The circuit 400 includes a wordline connecting part 410 for connecting a MWL to one or more SWLs. The circuit 400 represents an exemplary hierarchical wordline structure where one main wordline is connected to four sub wordlines. The four sub wordlines are merely exemplary, and it shall be understood that the number of sub wordlines assigned to one main wordline may be adjusted in alternate embodiments.

The wordline connecting part 410 is located between memory blocks, here between BLK1 and BLK2, and has four NMOS transistors 412. Each transistor has a gate connecting to a corresponding one of four sub wordline selection signals, SA00 through SA11, a drain connecting to the MSWL and a source connecting to a corresponding one of the sub wordlines SWL0 through SWL3. In addition, each sub wordline is connected to the cathode end of a diode of a memory cell such as the cell 100 of FIG. 1. Thus, write current or read current flows to a sub wordline when a write operation or a read operation occurs, respectively.

For example, the variable resistive memory device 300 of FIG. 3 can be modified to include at least a second wordline connecting switch in signal communication with the main wordline, at least a second sub-wordline in signal communication with the second wordline connecting switch, and a sub-wordline selection signal generator in signal communication with a control input of each of the first and second wordline connecting switches.

Figure 5:
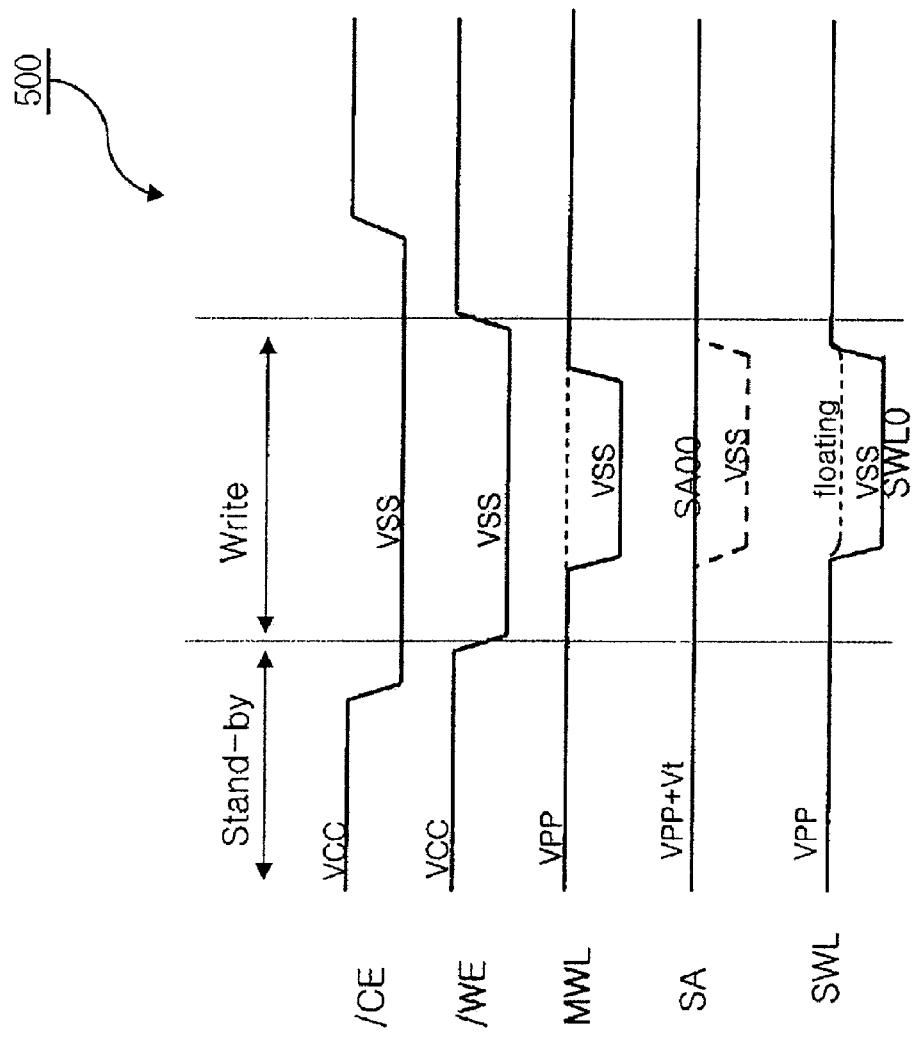
FIG. 5 shows a timing diagram for a memory device having a wordline switch in accordance with FIG. 4.

Turning to FIG. 5, a timing diagram for a memory device having the wordline connecting part 410 of FIG. 4 is indicated generally by the reference numeral 500. In the diagram 500, it is assumed that the SWL0 is activated. Here, /CE is a chip enable, /WE is a write enable, and SA is a sub wordline selection signal. The dotted line portions are indicative of non-selected lines. The solid line portions are indicative of the selected line.

In standby mode, all MWLs stay at a first voltage (VPP), which may be obtained by boosting VAC. In addition, all SAs stay at a second voltage (VPP+Vt), so that all SWLs have the first voltage through transistors N0 through N3. The diodes in the memory cells are in a reverse bias state, so current through the variable resistive material does not flow in the standby mode.

In a write operation, when /CE and /WE go to low, the write operation starts. The row decoder selects one MWL and the main wordline driver drives the one selected MWL to get VSS from the first voltage. The non-selected MWLs still have the first voltage. In addition, one of the sub word selection signals SA00 still has the second voltage and the others, namely SA01 SA10 and SA11, drive to have VSS from the second voltage. Thus, only the N0 transistor turns on and VSS of the selected MWL can be transferred to SWL0, Due to the voltage difference between the data voltage of bitline delivered through the data in/out circuits and the VSS of the selected SWL0, the write current flows through the variable resistive material from the bitline to SWL0, During the write operation, the non-selected SWL is in a floating state, If the voltage difference between the bitline and the non-selected SWL can stay below a built in potential (Vbi) of the diode of the memory cell, current through non-selected memory cell does not flow in the write operation. The timing diagram 500 is similarly applicable when a read operation occurs.

Figure 6:
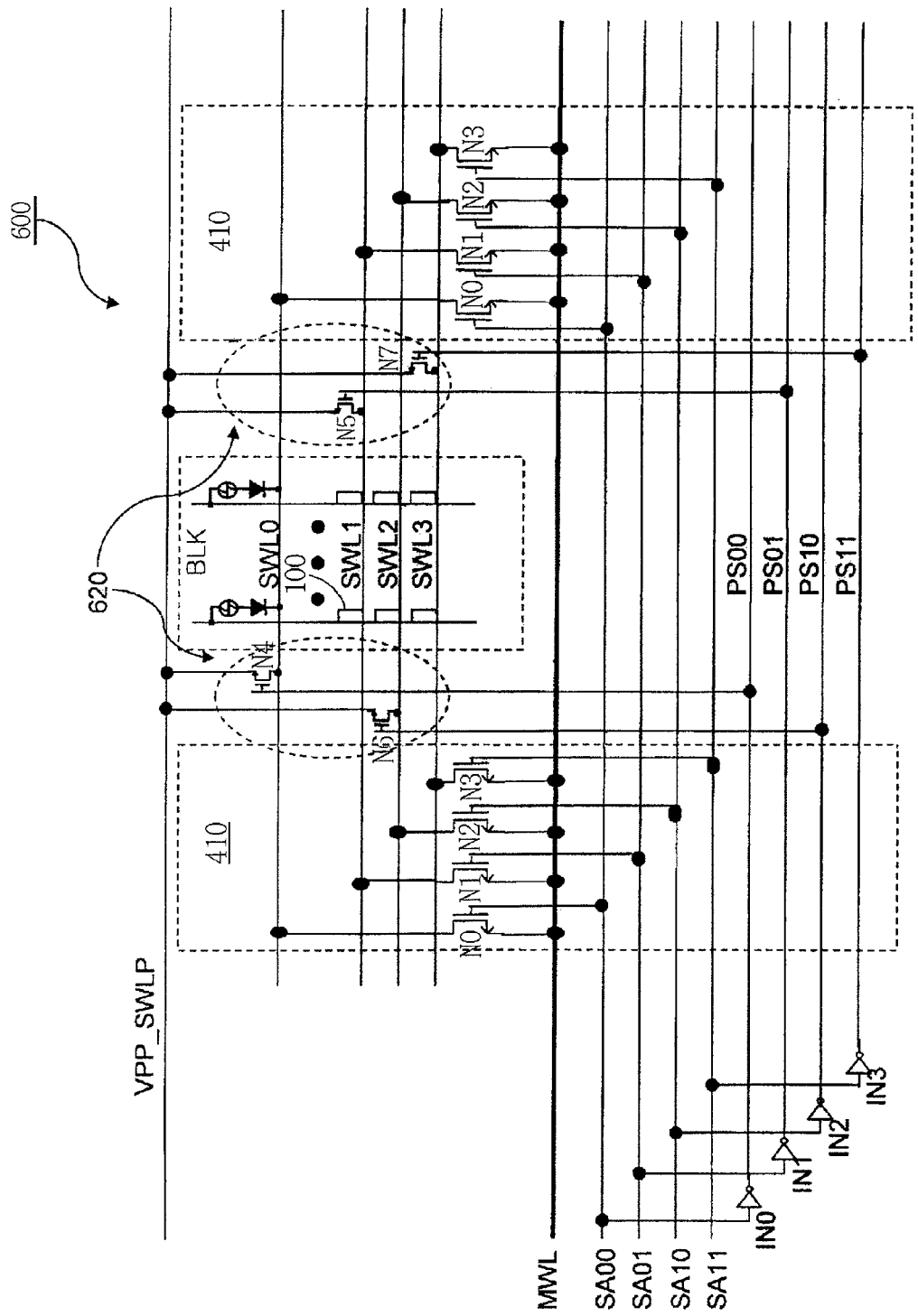
FIG. 6 shows a schematic circuit diagram for another wordline switch of a memory device in accordance with an exemplary embodiment of the present disclosure.

Turning now to FIG. 6, a wordline connecting part or switch according to another embodiment of the present disclosure is indicated generally by the reference numeral 600. The wordline connecting part or switch 600 includes a pre-charging part 620, where VPP_SWLP is a sub wordline pre-charge voltage. A memory device further includes the pre-charging part 620 to prevent a floating state of non-selected SWLs while a write operation or a read operation occurs. A memory block BLK is disposed between the pre-charging parts 620. The pre-charging part has a plurality of transistors, N5 through N8, each of which has a gate connecting to a corresponding one of the pre-charging signals PS00 through PS11, a drain connecting to the sub wordline pre-charge voltage (VPP_SWLP) and a source connecting to a corresponding one of the sub wordlines.

The VPP_SWLP may be same level as the first voltage VPP. The pre-charging signals PS00 through PS11 are inverted signals of sub wordline selection signals SA00 through SA11 generated by inverters. The inverters may be located in the row decoder and main wordline driver. In addition the pre-charging part can comprise only PMOS transistors instead of NMOS transistors. In this case, the sub wordline selection signal is directly connected to the gate of PMOS transistors. In addition, N4 and N6 are located towards the left side of the memory block and pre-charge SWL0 and SWL2 respectively, in response to the corresponding pre-charging signal. N5 and N7 are located towards the right side of the memory block and pre-charge SWL1 and SWL3, respectively, in response to the corresponding pre-charging signal. This method can be used to minimize the required size for the pre-charging part. Thus, the pre-charging part can pre-charge non-selected SWLs as VPP_SWLP white a write or a read operation occurs.

For example, the variable resistive memory device 400 of FIG. 4 can be modified to include at least one sub-wordline pro-charging switch in signal communication with the sub-wordline.

Figure 7:
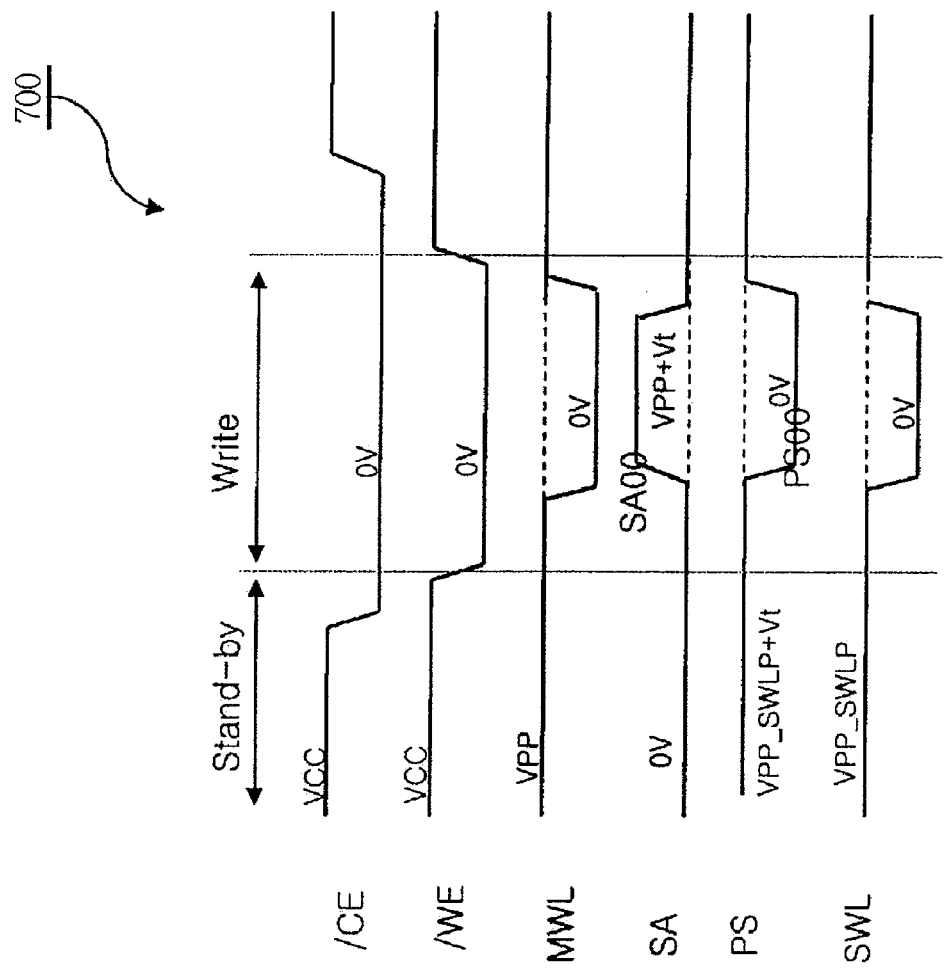
FIG. 7 shows a timing diagram for a memory device having a wordline switch in accordance with FIG. 6.

As shown in FIG. 7, a timing diagram for a memory device including the wordline connecting part 600 of FIG. 6 is indicated generally by the reference numeral 700, in the diagram 700, it is assumed that SWL0 has been activated. Here, /CE is a chip enable, /WE is a write enable, SA is a sub wordline selection signal, and PS is a pre-charging signal. Dotted lines are indicative of non-selected lines. Solid lines are indicative of a selected line.

In standby mode, all MWL stay at first voltage VPP, which may be obtained by boosting VCC. All SA stay at VSS, and pre-charging signals PS00 through PS11 stay at VPP_SWLP plus Vt, so that all SWLs have the VPP_SWLP through the respective transistors N4 through N7. The diodes in the memory cells are in a reverse bias state, so current through the resistive variable material does not flow in the standby mode.

In a write operation when /CE and /WE go to low the write operation starts, The row decoder selects one MWL and the main wordline driver drives the one MWL to get VSS from the first voltage. The non-selected MWLs still have the first voltage, In addition, one of the sub word selection signals, such as SA00 drives to have VPP+Vt and the others have VSS. Thus, only the N0 transistor turns on, and VSS of the selected MVL can be transferred to SWL0. Further, only N4 in the pre-charging part turns off by the "low" of PS00 and the other transistors in the pre-charging part remain on, so that non selected SVLs can stay as VPP _SWLP. Due to the voltage difference between the data voltage of the bitline delivered by the data in/out circuits and VSS of the selected SWL0, the write current flows through the variable resistive material from the bitline to SWL0.

The timing diagram 700 is similarly applicable when a read operation occurs. A write voltage applied to the bitline when a write operation occurs is different from a read voltage applied to the bitline when a read operation occurs, in that the write voltage is larger than the read voltage.

Figure 8:
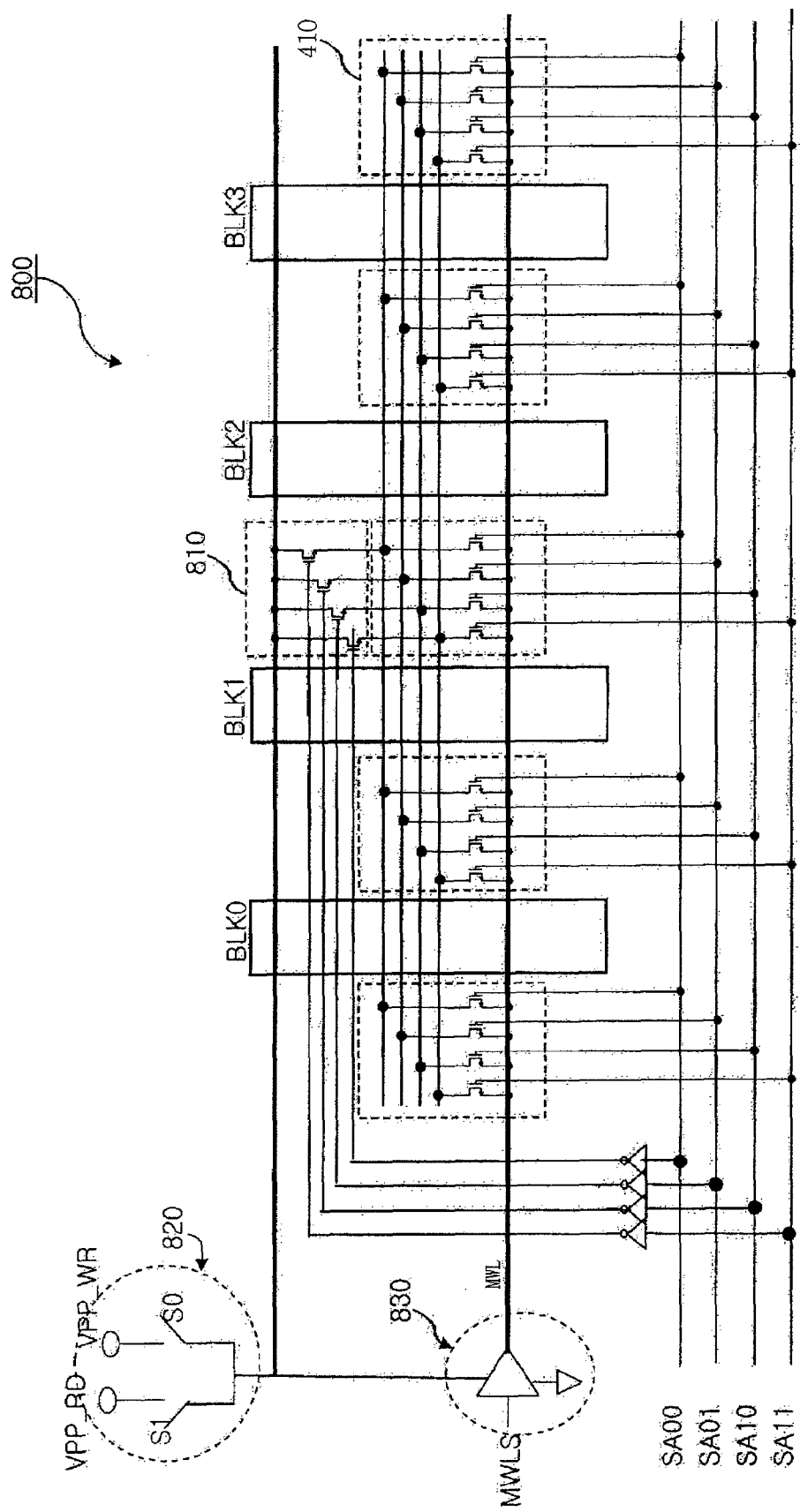
FIG. 8 shows a schematic circuit diagram for a memory device having a wordline connecting part, pre-charging part and voltage switching part in accordance with an exemplary embodiment of the present disclosure.

Turning to FIG. 8, a memory device having a wordline connecting part, pre-charging part and voltage switching part according to another embodiment of the present disclosure is indicated generally by the reference numeral 800. Referring back to FIG. 6, the memory device 600 has only one sub wordline pre-charge voltage VPP_SWLP. VPP_SWLP is larger than the write voltage so as to sustain reverse bias of a diode between a non-selected SWL and the bitline. In addition, VPP_SWLP can be generated by boosting VCC. VPP_SWLP is determined by the write voltage of the bitline to prevent disturbing non-selected memory cells. If a pre-charging voltage of the non-selected sub wordline can be controlled in response to write operations versus read operations power consumption of memory device can be further reduced.

The memory device 800 of FIG. 8 includes a pre-charging part 810, a pre-charge voltage selector or voltage switching part 820, and a main wordline driver 830. Thus, the memory device 800 differs from the memory device 600 of FIG. 6 in that it has the voltage switching part 820. The voltage switching part 820 includes a first switch S0 responsive to a write signal /WR, and a second switch S1 responsive to a read signal RD or a standby signal STY. The first switch S0 supplies a first boosting voltage VPP_WR to a main wordline driver and to the pre-charging part 810 during a write operation. The second switch Si supplies a second boosting voltage VPP_RD to the main wordline driver and to the pre-charging part 810 during a read operation. Here, VPP_WR is larger than VPP_RD. Thus, because the memory device 800 uses VPP_WR and VPP_RD selectively according to whether a write operation or a read operation is executed, power consumption can be further reduced.

For example, the variable resistive memory device 600 of FIG. 6 can be modified to include a pre-charge voltage selector in signal communication with the sub-wordline pre-charging switch, the pre-charge voltage selector having a first selector switch in signal communication with a first voltage greater than a write voltage, and a second selector switch in signal communication with a second voltage less than the first voltage and greater than a read voltage.

Figure 9:
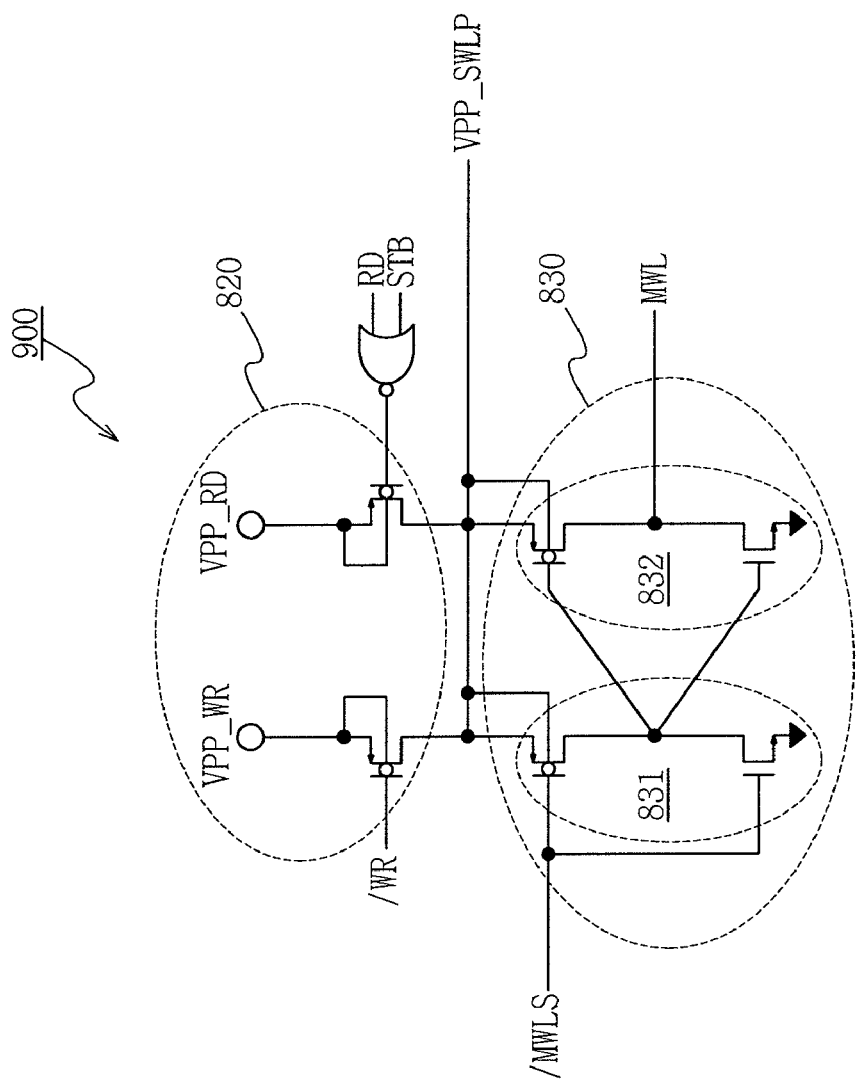
FIG. 9 shows a schematic circuit diagram for a circuit including a voltage switching part and a main wordline driver in accordance with FIG. 8.

Turning now to FIG. 9 a circuit including a voltage switching part and a main wordline driver is indicated generally by the reference numeral 900, The circuit 900 may be used in the memory device 800 of FIG. 8, for example. The circuit 900 includes a pre-charge voltage selector or voltage switching part 820, a main wordline driver 830 that includes a control part 831 and a driving part 832, Here, VPP_WR is a first boosting voltage for a write operation, VPP_RD is a second boosting voltage for a read operation. /WR is a signal indicating a write operation, RD is a signal indicating a read operation, VPP_SWLP is connected to the pre-charging part. /MWLS is a main wordline selection signal, As used herein, the "l" means that the signal is activated by a negative logic value.

Here, the main wordline driver 830 includes the control part 831 and the driving part 832, The control part includes first PMOS and NMOS transistors, and the driving part includes second PMOS and NMOS transistors, In the control part 831, the first PMOS transistor has a source connected to the pre-charge voltage selector 820, a gate connected to /MWLS, and a drain connected to a shared terminal. The first NMOS transistor has a drain connected to the shared terminal, a gate connected to /MWLS, and a source connected to ground.

In the driving part 832, the second PMQS has a gate connected to the shared terminal, a source connected to the pre-charge voltage selector 820, and a drain connected to the MWL. The second NMOS has a gate connected to the shared terminal, a drain connected to the MWL, and a source connected to ground.

Table 1 shows signal states for the circuits 800 and 900 according to operating conditions.

TABLE 1

| | STB | RD | /WR | /MWLS | | Voltage of MWL | Voltage of SWL |
|---|---|---|---|---|---|---|---|
| Standby | H | L | H | H | | VPP_RD | VPP_RD |
| Read operation | L | H | H | Selected | L | VSS | VSS |
| | | | | Non selected | H | VPP_RD | VPP_RD |
| Write operation | L | L | L | Selected | L | VSS | VSS |
| | | | | Non selected | H | VPP_WR | VPP_WR |

Thus, in a standby mode, all MWL and all SWL have VPP_RD. For a read operation, the selected MWL has VSS and selected SWL has VSS, but non-selected MWL and non-selected SWL have VPP_RD. For a write operation, the selected MWL has VSS and the selected SWL has VSS, but non-selected MWL and non-selected SWL have VPP_WR.

Figure 10:
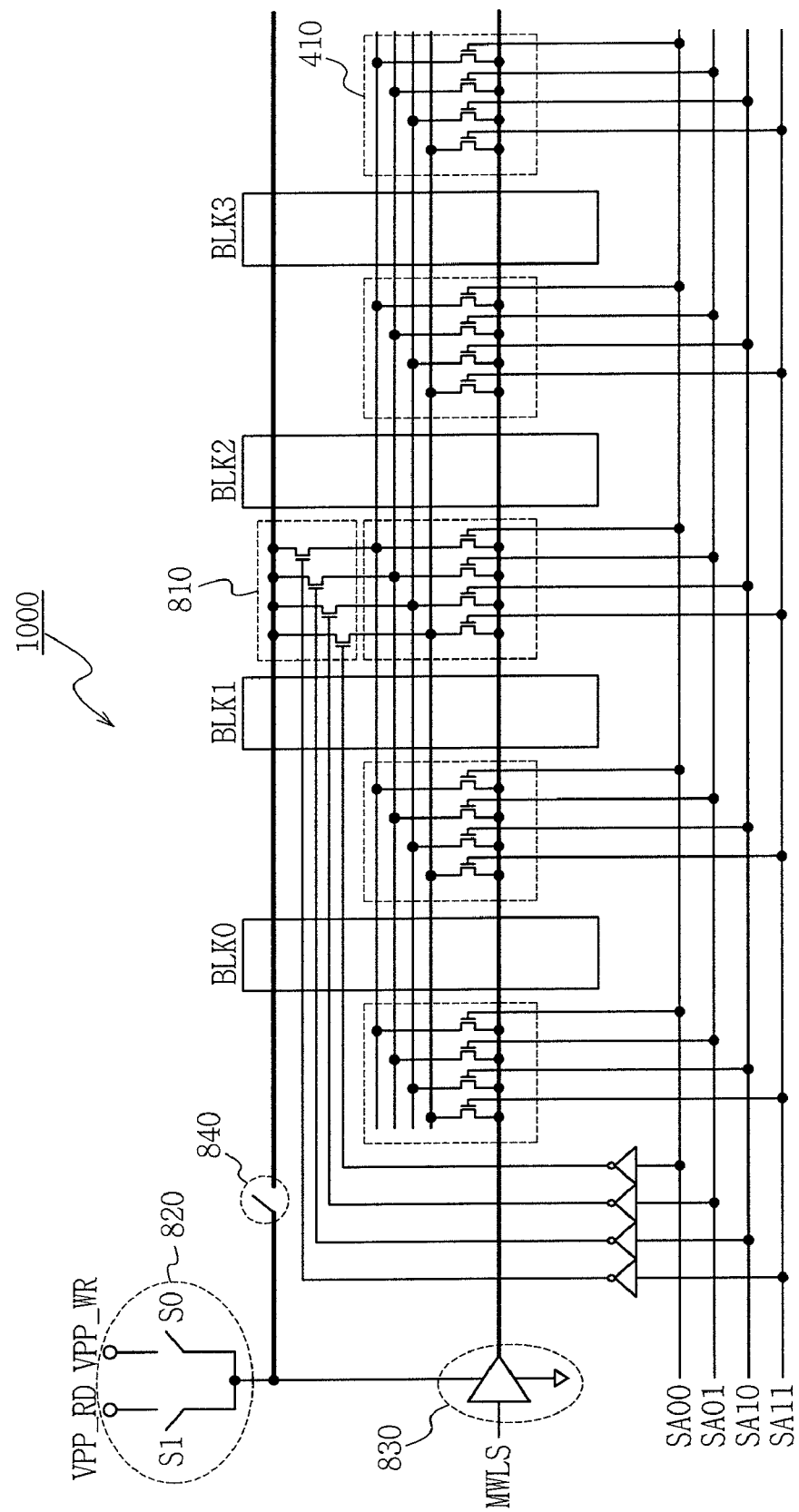
FIG. 10 shows a schematic circuit diagram for a memory device having a control switch in accordance with an exemplary embodiment of the present disclosure.

As shown in FIG. 10, a memory device having a control switch is indicated generally by the reference numeral 1000. The memory device 1000 has a control switch 840 to enable or disable the pre-charging part according to this embodiment of the present disclosure, The control switch may be controlled by Mode Register Set (MRS) to enable the pre-charging part Otherwise, the memory device 1000 is similar to the memory device 800 of FIG. 8, so duplicate description is omitted.

For example, a variable resistive memory device can include a main wordline, a wordline connecting switch in signal communication with the main wordline, a sub-wordline in signal communication with the wordline connecting switch, a variable resistive memory cell having a variable resistor in signal communication with a first terminal of a switching element, a second terminal of the switching element disposed in signal communication with the sub-wordline, a sub-wordline pre-charging switch in signal communication with the sub-wordline, a pre-charge voltage selector in signal communication with the sub-wordline pre-charging switch, the pre-charge voltage selector having a first switch in signal communication with a first voltage greater than a write voltage, and a second switch in signal communication with a second voltage less than the first voltage and greater than a read voltage, and a pre-charge disabling switch disposed between the pre-charge voltage selector and the sub-wordline pre-charging switch for disabling pre-charging of sub-wordlines.

Figure 11:
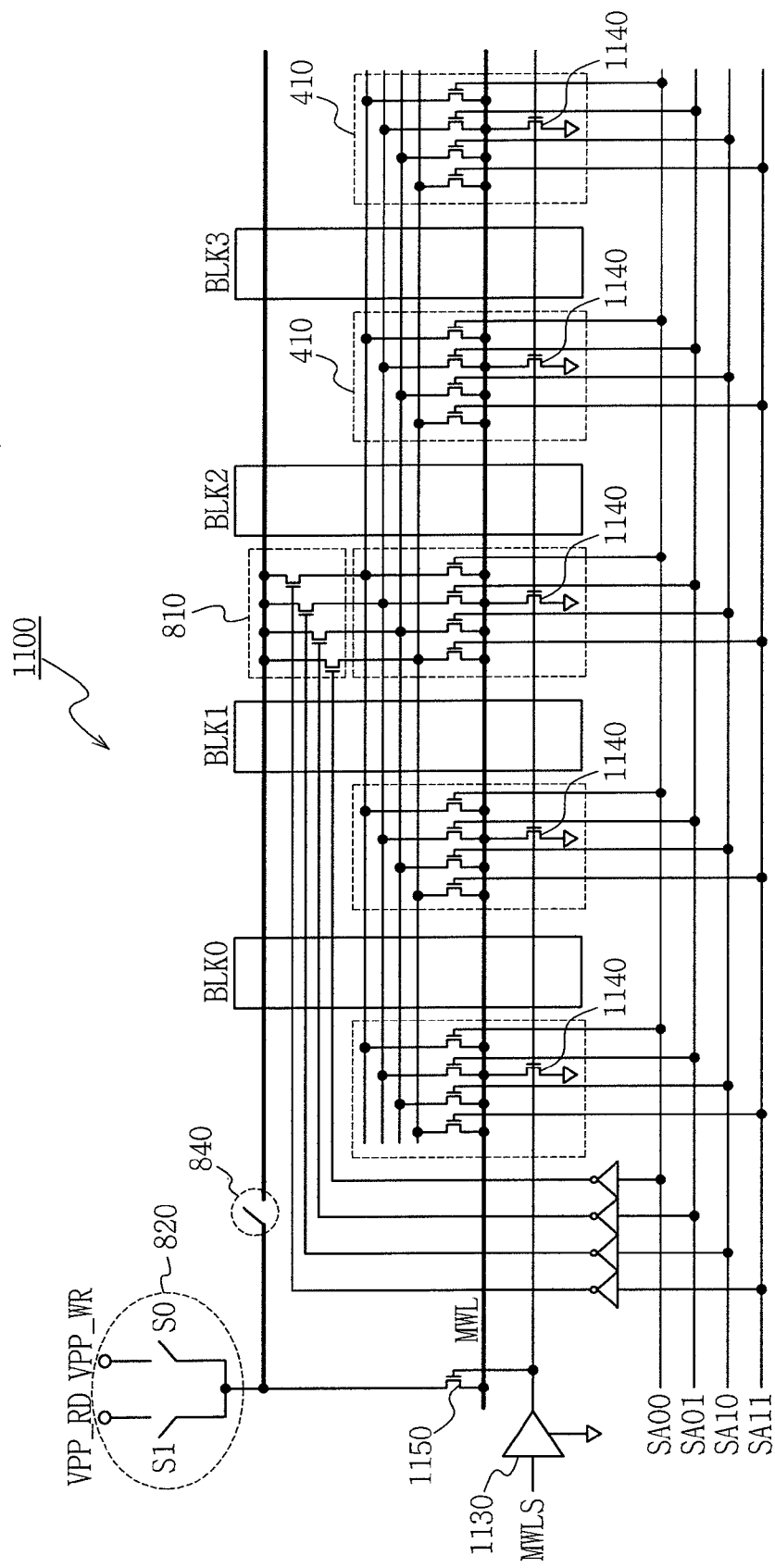
FIG. 11 shows a schematic circuit diagram for a memory device having discharging transistors and a precharging transistor in accordance with an exemplary embodiment of the present disclosure.

Turning to FIG. 11, another exemplary embodiment memory device is indicated generally by the reference numeral 1100. The memory device 1100 has a discharging switch or transistor 1140 in each wordline connecting part and a main wordline pre-charging switch or transistor 1150 The main wordline pre-charging switch or transistor 1150 is disposed between the voltage switching part 820 and the MWL, with a control input or gate in signal communication with a switch driver 1130 for the MWLS signal. The discharging switches or transistors 1140 are each disposed relative to the wordline connecting parts 410 and connected between the MWL and ground with a control input or gate in signal communication with the switch driver 1130. Otherwise, the memory device 100 is similar to the memory device 1000 of FIG. 10, so duplicate description is omitted.

If the main wordline has a large resistance, discharging the main wordline to VSS from VPP_WR or VPP_RD may take too much time. Thus, the time required for discharge may constrain high-speed operation. Therefore, the memory circuit 1100 provides exemplary transistors constructed as the discharging transistors 1140 and the pre-charging transistor 1150.

Table 2 shows signal states for the circuit 1100 according to operating conditions.

TABLE 2

| | | SA | PS | Voltage of MWL | Voltage of SWL |
|---|---|---|---|---|---|
| Standby | | L | H | VPP_RD | VPP_RD |
| Read operation | Selected | H | L | VSS | VSS |
| | Non selected | L | H | VPP_RD | VPP_RD |
| Write operation | Selected | H | L | VSS | VSS |
| | Non selected | L | H | VPP_WR | VPP_WR |

As indicated in Table 2, each PS signal corresponds to an inverted SA signal. When a PS signal is High, a VPP voltage level corresponding to a RD or a WR operation, respectively, is substantially conducted from a MWL to a SWL.

Referring back to FIGS. 8 through 11, SA signals SA00 SA01 SA10 and SA11 are inverted to obtain PS signals PS00, PS01, PS10 and PS11, respectively. The PS signals PS00, PS01 PS10 and PS11, in turn, are applied to the gates of the transistors connecting the appropriate VPP voltage level to the sub-wordlines SWL0, SWL1, SWL2 and SWL3, respectively.

For example, the variable resistive memory device 1000 of FIG. 10 may be modified to include a switch driver, a main wordline pre-charging switch connected between the pre-charge voltage selector and the main wordline with a control input in signal communication with the switch driver, and at least one discharging switch connected between the main wordline and ground with a control input in signal communication with the switch driver.

Although illustrative embodiments have been described herein with reference to the accompanying drawings, it is to be understood that the present disclosure is not limited to those precise embodiments, and that various other changes and modifications may be effected therein by those of ordinary skill in the pertinent art without departing from the scope or spirit of the present disclosure. All such changes and modifications are intended to be included within the scope of the present disclosure as set forth in the appended claims.

What is claimed is:

1. A variable resistive random-access memory (RAM) device, comprising:
    a main wordline;
    a wordline connecting switch in signal communication with the main wordline;

a sub-wordline in signal communication with the wordline connecting switch;

a variable resistive memory cell having a variable resistance in signal communication with a first terminal of a switching element, a second terminal of the switching element disposed in signal communication with the sub-wordline;

a sub-word line pre-charging switch in signal communication with the sub-wordline; and a pre-charge voltage selector in signal communication with the sub-wordline pre-charging switch, the pre-charge voltage selector having a first selector switch in signal communication with a first voltage greater than a write voltage, and a second selector switch in signal communication with a second voltage less than the first voltage.

2. A device as defined in claim 1 wherein the wordline connecting switch is a single transistor.

3. A device as defined in claim 2 wherein the single transistor is NMOS.

4. A device as defined in claim 1, further comprising:
a second word line connecting switch in signal communication with the main wordline;
a second sub-wordline in signal communication with the second wordline connecting switch; and
a sub-wordline selection signal generator in signal communication with a control input of each of the first and second wordline connecting switches.

5. A device as defined in claim 4 wherein the first sub-wordline is selected and the second sub-word line is non-selected by the sub-word line selection signal generator, which opens the word line connecting switch for the non-selected second sub-wordline during a read or a write operation.

6. A device as defined in claim 5 wherein the first and second wordline connecting switches are closed and the main wordline has substantially the same voltage potential as the first and second sub-wordlines in a standby mode.

7. A device as defined in claim 4 wherein the first sub-wordline is selected and the second sub-wordline is non-selected by the sub-wordline selection signal generator, which closes the wordline connecting switch for the selected second sub-wordline during a read or a write operation.

8. A device as defined in claim 1 wherein a control input of the sub-wordline pre-charging switch is in inverted signal communication with a control input of the wordline connecting switch.

9. A device as defined in claim 1, further comprising a main wordline pre-charging transistor in signal communication with the main wordline.

10. A device as defined in claim 1, further comprising a main wordline discharging transistor in signal communication with the main wordline.

11. A variable resistive memory device, comprising:
a main word line having a voltage;
a wordline connecting switch in signal communication with the main wordline;
a sub-wordline having the voltage in signal communication with the wordline connecting switch;
a variable resistive memory cell having a variable resistance in signal communication with a first terminal of a switching element, a second terminal of the switching element disposed in signal communication with the sub-wordline;
a sub-wordline pre-charging switch in signal communication with the sub-wordline; and
a pre-charge voltage selector in signal communication with the sub-wordline pre-charging switch, the pre-charge voltage selector having a first selector switch in signal communication with a first voltage greater than a write voltage, and a second selector switch in signal communication with a second voltage less than the first voltage and greater than a read voltage.

12. A device as defined in claim 11, further comprising a NOR gate in signal communication with a control input of the second selector switch, the NOR gate having a first input for receiving an input indicative of a read signal and a second input for receiving an input indicative of a standby signal.

13. A device as defined in claim 11, further comprising a main wordline driver in signal communication between the pre-charge voltage selector and the main wordline for driving the main wordline to one of the voltages selected by the pre-charge voltage selector.

14. A device as defined in claim 13, the main wordline driver comprising:
a first PMOS transistor having a source connected to the pre-charge voltage selector, a gate connected to a signal line indicative of main wordline selection, and a drain connected to a shared terminal;
a first NMOS transistor having a drain connected to the shared terminal, a gate connected to the signal line indicative of main word line selection, and a source connected to ground;
a second PMOS having a gate connected to the shared terminal, a source connected to the pre-charge voltage selector, and a drain connected to the main wordline; and
the second NMOS having a gate connected to the shared terminal, a drain connected to the main wordline, and a source connected to ground.

15. A variable resistive memory device, comprising:
a main wordline;
a wordline connecting switch in signal communication with the main wordline;
a sub-wordline in signal communication with the wordline connecting switch;
a variable resistive memory cell having a variable resistor in signal communication with a first terminal of a switching element, a second terminal of the switching element disposed in signal communication with the sub-wordline;
a sub-wordline pre-charging switch in signal communication with the sub-wordline;
a pre-charge voltage selector in signal communication with the sub-wordline pre-charging switch, the pre-charge voltage selector having a first switch in signal communication with a first voltage greater than a write voltage, and a second switch in signal communication with a second voltage less than the first voltage and greater than a read voltage; and
a pre-charge disabling switch disposed between the pre-charge voltage selector and the sub-wordline pre-charging switch for disabling pre-charging of sub-wordlines.

16. A variable resistive memory device as defined in claim 15, further comprising:
a switch driver;
a main word line pre-charging switch connected between the pre-charge voltage selector and the main wordline with a control input in signal communication with the switch driver; and
at least one discharging switch connected between the main word line and ground with a control input in signal communication with the switch driver.

* * * * *